US011164911B2

(12) United States Patent
Lu et al.

(10) Patent No.: US 11,164,911 B2
(45) Date of Patent: Nov. 2, 2021

(54) DISPLAYS WITH WHITE ORGANIC LIGHT-EMITTING DIODES

(71) Applicant: Apple Inc., Cupertino, CA (US)

(72) Inventors: Chun-Yang Lu, Taoyuan (TW); Rui Liu, San Jose, CA (US); Lun Tsai, Zhubei (TW)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/649,590

(22) PCT Filed: Sep. 24, 2018

(86) PCT No.: PCT/US2018/052450
§ 371 (c)(1),
(2) Date: Mar. 20, 2020

(87) PCT Pub. No.: WO2019/067365
PCT Pub. Date: Apr. 4, 2019

(65) Prior Publication Data
US 2020/0388652 A1 Dec. 10, 2020

Related U.S. Application Data

(60) Provisional application No. 62/564,732, filed on Sep. 28, 2017.

(51) Int. Cl.
*H01L 27/32* (2006.01)
*H01L 51/52* (2006.01)

(52) U.S. Cl.
CPC ........ *H01L 27/322* (2013.01); *H01L 51/5265* (2013.01); *H01L 51/5271* (2013.01); *H01L 2251/303* (2013.01)

(58) Field of Classification Search
CPC ............... H01L 27/322; H01L 51/5265; H01L 51/5271
See application file for complete search history.

(56) References Cited

U.S. PATENT DOCUMENTS 7,023,013 B2 4/2006 Ricks et al.
7,129,634 B2 10/2006 Boroson et al.
(Continued)

FOREIGN PATENT DOCUMENTS

| EP | 2048722 A1 | 4/2009 |
| EP | 2744012 A1 | 6/2014 |
| EP | 3018726 A1 | 5/2016 |

*Primary Examiner* — Anthony Ho
(74) *Attorney, Agent, or Firm* — Treyz Law Group, P.C.; Kendall W. Abbasi (57) ABSTRACT

A display may have an array of pixels formed from organic light-emitting diodes and thin-film transistor circuitry. The organic light-emitting diodes may be interposed between a substrate (30) and a cover layer (70). The organic light-emitting diodes may be white light-emitting diodes (26) that emit white light that is filtered through a color filter array (76) to produce colored light. The color filter array may be located above or below the array of light-emitting diodes. A microcavity may be formed between the substrate (30) and each light-emitting diode (26). The microcavity may be formed from an anode (36) in the light-emitting diode and first (86) and second layers (78) with different refractive indices. The low-refractive-index layer may be formed from a color filter in the color filter array. Light from the light-emitting diode may resonate within the microcavity beneath each light-emitting diode before exiting the display as colored light.

15 Claims, 8 Drawing Sheets (56) References Cited

U.S. PATENT DOCUMENTS

| | | |
|---|---|---|
| 7,180,238 B2 | 2/2007 | Winters |
| 7,247,394 B2 | 7/2007 | Hatwar et al. |
| 7,888,858 B2 | 2/2011 | Cok et al. |
| 7,948,172 B2 | 5/2011 | Cok et al. |
| 2010/0066651 A1 | 3/2010 | Lee et al. |
| 2014/0159021 A1 | 6/2014 | Song et al. |

DISPLAYS WITH WHITE ORGANIC LIGHT-EMITTING DIODES

This application claims priority to U.S. provisional patent application No. 62/564,732, filed on Sep. 28, 2017, which is hereby incorporated by reference herein in its entirety.

BACKGROUND

This relates generally to electronic devices with displays and, more particularly, to electronic devices with organic light-emitting diode displays.

Electronic devices often include displays. Displays such as organic light-emitting diode displays include arrays of pixels that emit light to display images for a user. The pixels of a display may include subpixels of different colors to provide the display with the ability to display color images. The organic light-emitting diodes are controlled by thin-film transistor circuitry.

It can be challenging to achieve high resolution displays with organic light-emitting diode pixels. Displays sometimes use white organic light-emitting diodes with red, green, and blue color filters to achieve higher resolution. If care is not taken, however, displays with white organic light-emitting diodes may not exhibit desired levels of optical performance.

It would therefore be desirable to be able to provide improved organic light-emitting diode displays.

SUMMARY

A display may have an array of pixels on a substrate. The display may be an organic light-emitting diode display and the pixels may include organic light-emitting diodes of different colors. The display may include thin-film transistor circuitry that controls the organic light-emitting diode pixels.

The organic light-emitting diodes may be interposed between a substrate and a cover layer. The organic light-emitting diodes may be white light-emitting diodes that emit white light that is filtered through a color filter array to produce colored light. The color filter array may be located above or below the array of light-emitting diodes.

A microcavity may be formed between the substrate and each light-emitting diode. The microcavity may be formed from an anode of the light-emitting diode and first and second layers with different refractive indices. In one illustrative arrangement, the color filter array is located below the light-emitting diode array and is used as the low-refractive-index layer in the microcavity. Light from the light-emitting diode may resonate within the microcavity beneath each light-emitting diode, passing through the color filter multiple times before exiting the display as colored light.

In another suitable arrangement, the color filter array is located above the light-emitting diode array and an oxide layer is used as the low-refractive-index layer in the microcavity beneath each light-emitting diode.

The white light-emitting diodes may be formed from an emissive layer that mixes primary or complementary colors to produce white light, may be formed from multiple emissive layers that mix primary or complementary colors to produce white light, may be formed from an emissive layer and a phosphor that together produce white light, or may be formed from multiple light-emitting diode units that are stacked in tandem and connected in series to produce white light.

DETAILED DESCRIPTION

Figure 1:
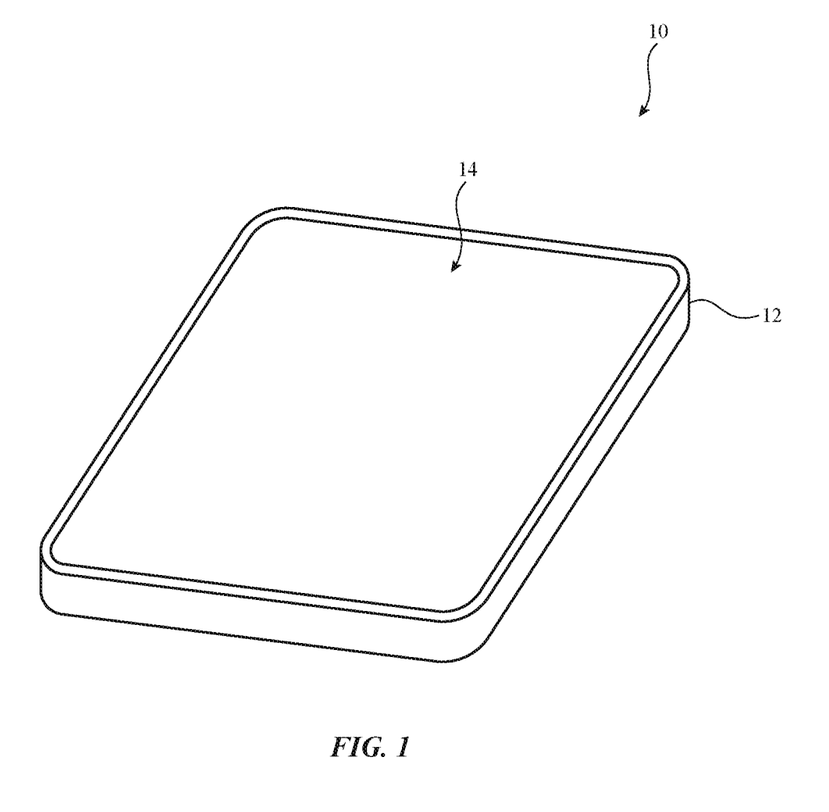
FIG. 1 is a perspective view of an illustrative electronic device having a display in accordance with an embodiment.

An illustrative electronic device of the type that may be provided with a display is shown in FIG. 1. Electronic device 10 may be a computing device such as a laptop computer, a tablet computer, a cellular telephone, a media player, or other handheld or portable electronic device, a smaller device such as a wrist-watch device, a pendant device, a headphone or earpiece device, a device embedded in eyeglasses or other equipment worn on a user's head, or other wearable or miniature device, a computer monitor or other display containing an embedded computer or other electronic equipment, a computer display or other monitor that does not contain an embedded computer, a gaming device, a navigation device, an embedded system such as a system in which electronic equipment with a display is mounted in a kiosk or automobile, equipment that implements the functionality of two or more of these devices, or other electronic equipment. In the illustrative configuration of FIG. 1, device 10 is a portable device such as a cellular telephone, media player, tablet computer, wrist device, or other portable computing device. Other configurations may be used for device 10 if desired. The example of FIG. 1 is merely illustrative.

In the example of FIG. 1, device 10 includes a display such as display 14 mounted in housing 12. Housing 12, which may sometimes be referred to as an enclosure or case, may be formed of plastic, glass, ceramics, fiber composites, metal (e.g., stainless steel, aluminum, etc.), other suitable materials, or a combination of any two or more of these materials. Housing 12 may be formed using a unibody configuration in which some or all of housing 12 is machined or molded as a single structure or may be formed using multiple structures (e.g., an internal frame structure, one or more structures that form exterior housing surfaces, etc.).

Display 14 may be a touch screen display that incorporates a layer of conductive capacitive touch sensor electrodes or other touch sensor components (e.g., resistive touch sensor components, acoustic touch sensor components, force-based touch sensor components, light-based touch sensor components, etc.) or may be a display that is not touch-sensitive. Capacitive touch screen electrodes may be formed from an array of indium tin oxide pads or other transparent conductive structures. A touch sensor may be formed using electrodes or other structures on a display layer that contains a pixel array or on a separate touch panel layer that is attached to the pixel array (e.g., using adhesive).

Display 14 may include an array of pixels formed from liquid crystal display (LCD) components, an array of electrophoretic pixels, an array of plasma pixels, an array of organic light-emitting diode pixels or other light-emitting diodes, an array of electrowetting pixels, or pixels based on other display technologies. Configurations in which display 14 is an organic light-emitting diode display are sometimes described herein as an example. The use of organic light-emitting diode pixels to form display 14 is merely illustrative. Display 14 may, in general, be formed using any suitable type of pixels.

Display 14 may be protected using a display cover layer such as a layer of transparent glass or clear plastic. Openings may be formed in the display cover layer. For example, an opening may be formed in the display cover layer to accommodate a button, a speaker port, or other component. Openings may be formed in housing 12 to form communications ports (e.g., an audio jack port, a digital data port, etc.), to form openings for buttons, etc.

Figure 2:
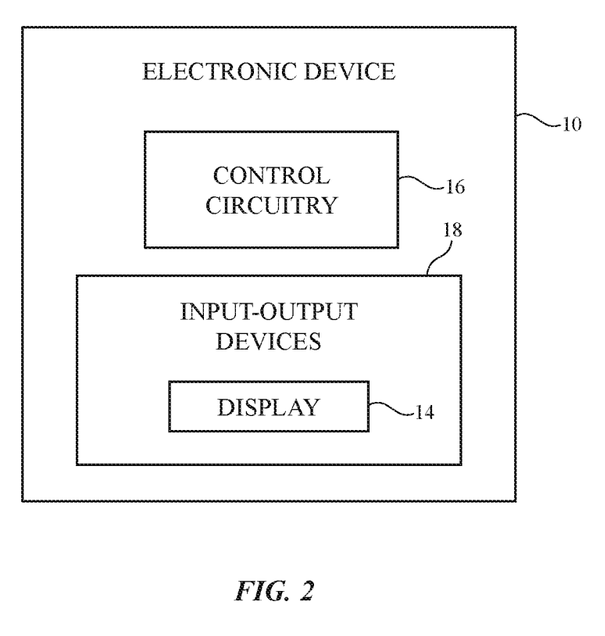
FIG. 2 is a schematic diagram of an illustrative electronic device having a display in accordance with an embodiment.

FIG. 2 is a schematic diagram of device 10. As shown in FIG. 2, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 16 may be used to control the operation of device 10. The processing circuitry may be based on one or more microprocessors, microcontrollers, digital signal processors, baseband processors, power management units, audio chips, application specific integrated circuits, etc.

Input-output circuitry in device 10 such as input-output devices 18 may be used to allow data to be supplied to device 10 and to allow data to be provided from device 10 to external devices. Input-output devices 18 may include buttons, joysticks, scrolling wheels, touch pads, key pads, keyboards, microphones, speakers, tone generators, vibrators, cameras, sensors, light-emitting diodes and other status indicators, data ports, etc. A user can control the operation of device 10 by supplying commands through input-output devices 18 and may receive status information and other output from device 10 using the output resources of input-output devices 18. Input-output devices 18 may include one or more displays such as display 14.

Control circuitry 16 may be used to run software on device 10 such as operating system code and applications. During operation of device 10, the software running on control circuitry 16 may display images on display 14 using an array of pixels in display 14.

Display 14 may have a rectangular shape (i.e., display 14 may have a rectangular footprint and a rectangular peripheral edge that runs around the rectangular footprint) or may have other suitable shapes. Display 14 may be planar or may have a curved profile.

Figure 3:
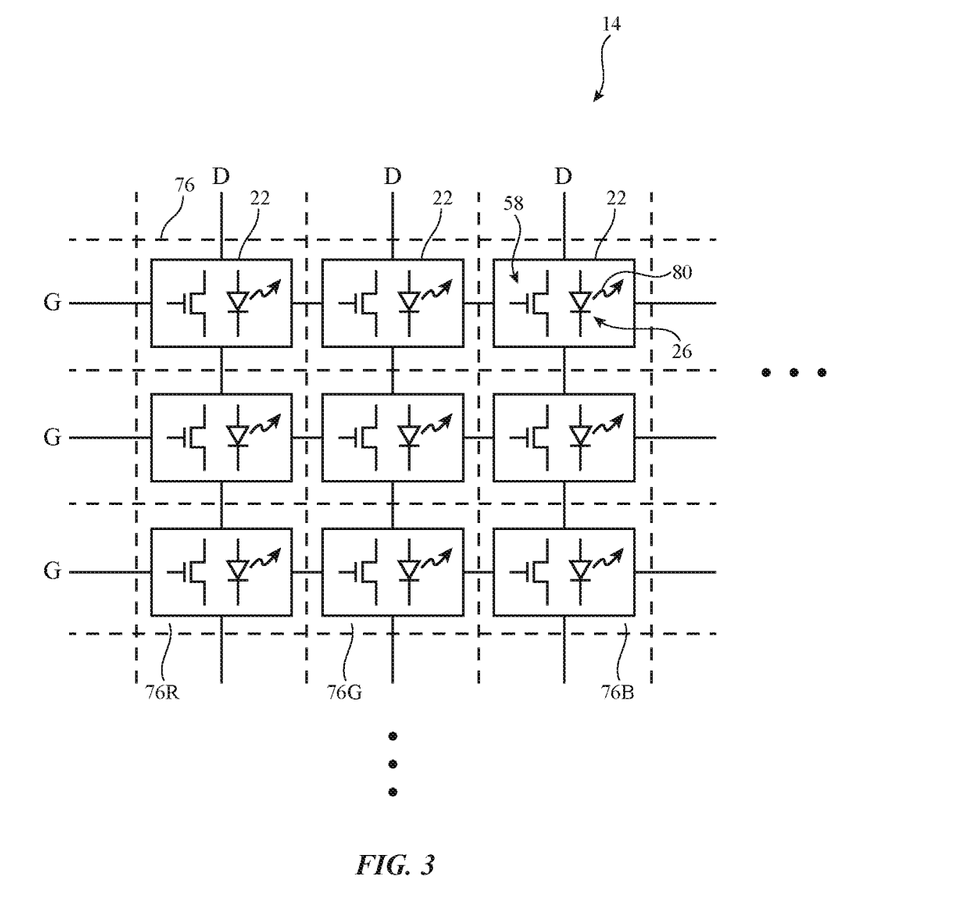
FIG. 3 is atop view of an illustrative display in an electronic device in accordance with an embodiment.

A top view of a portion of display 14 is shown in FIG. 3. As shown in FIG. 3, display 14 may have an array of pixels 22. Pixels 22 may receive data signals over signal paths such as data lines D and may receive one or more control signals over control signal paths such as horizontal control lines G (sometimes referred to as gate lines, scan lines, emission control lines, etc.). There may be any suitable number of rows and columns of pixels 22 in display 14 (e.g., tens or more, hundreds or more, or thousands or more). Each pixel 22 may have a light-emitting diode 26 that emits light 80 under the control of a pixel control circuit formed from transistor circuitry such as thin-film transistors 58 and thin-film capacitors). Transistors 58 may be polysilicon thin-film transistors, semiconducting-oxide thin-film transistors such as indium gallium zinc oxide transistors, or transistors formed from other semiconductors.

Display 14 may include pixels of different colors (sometimes referred to as subpixels). For example, display 14 may include red, green, and blue pixels or may include pixels of other colors. In one illustrative arrangement, color pixels 22 in display 14 may be formed using light-emitting diodes that emit light of the desired color. For example, red, green, and blue pixels may be formed by depositing red, green, and blue organic emissive material side-by-side on a substrate. With this type of arrangement, each light-emitting diode 26 emits colored light such as red light, blue light, or green light.

In another suitable configuration, color pixels 22 in display 14 may be formed using white organic light-emitting diodes that emit white light that is filtered through color filters such as color filters 76 to produce colored light. Color filters 76 may be formed from colored polymers that are deposited and patterned to form a color filter array. For example, red pixels 22 may be formed from white organic light-emitting diodes that are paired with red color filters 76R, green pixels 22 may be formed from white organic light-emitting diodes that are paired with green color filters 76G, and blue pixels 22 may be formed from white organic light-emitting diodes that are paired with blue color filters 76B. Display 14 may include pixels of other colors, if desired. Arrangements that pair white organic light-emitting diodes with red, green, and blue color filters are sometimes described herein as an example.

Figure 4:
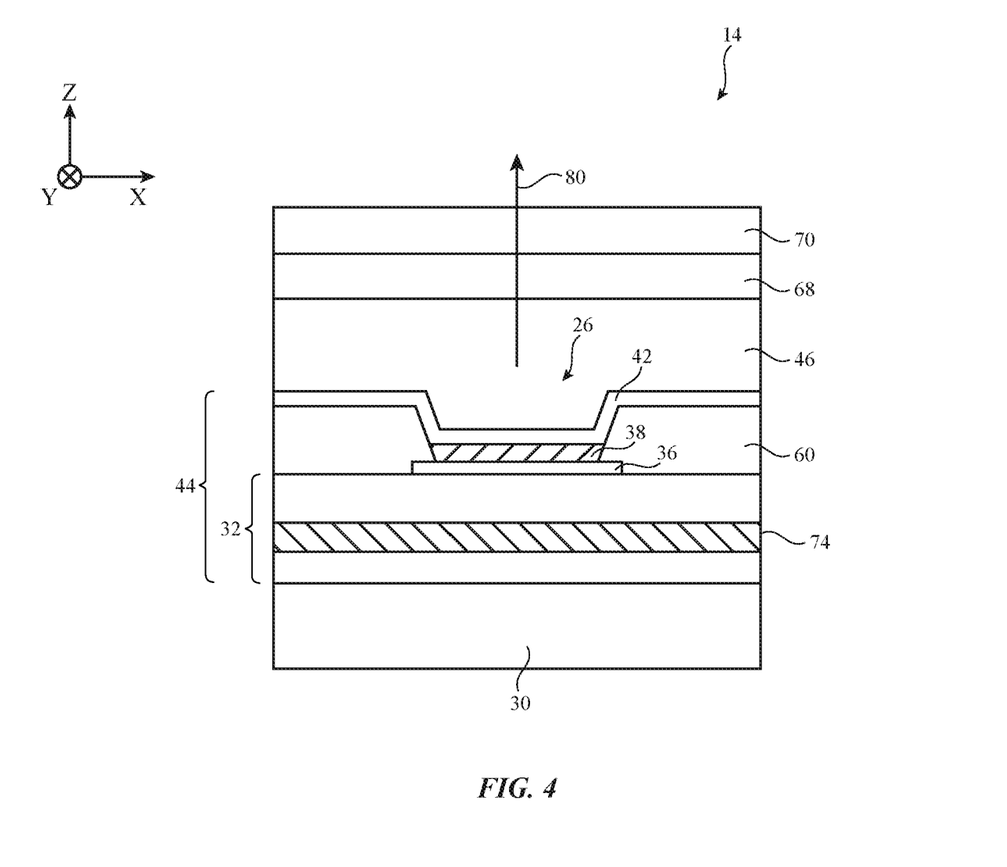
FIG. 4 is a cross-sectional side view of a portion of an illustrative organic light-emitting diode display in accordance with an embodiment.

A cross-sectional side view of a portion of an illustrative organic light-emitting diode display in the vicinity of one of light-emitting diodes 26 is shown in FIG. 4. As shown in FIG. 4, display 14 may include a substrate layer such as substrate layer 30. Substrate 30 may be formed from polymer, glass, sapphire, a semiconductor material such as silicon, or other suitable materials.

Thin-film transistor circuitry 44 may be formed on substrate 30. Thin-film transistor circuitry 44 may include layers 32. Layers 32 may include inorganic layers such as inorganic buffer layers, barrier layers (e.g., barrier layers to block moisture and impurities), gate insulator, passivation, interlayer dielectric, and other inorganic dielectric layers. Layers 32 may also include organic dielectric layers such as a polymer planarization layer. Metal layers and semiconductor layers may also be included within layers 32. For example, semiconductors such as silicon, semiconducting-oxide semiconductors, or other semiconductor materials may be used in forming semiconductor channel regions for thin-film transistors 58 (FIG. 3). Metal in layers 32 such as metal traces 74 may be used in forming transistor gate terminals, transistor source-drain terminals, capacitor electrodes, and metal interconnects.

As shown in FIG. 4, light-emitting diode 26 may be formed within an opening in pixel definition layer 60. Pixel definition layer 60 may be formed from a patterned photoimageable polymer such as polyimide and/or may be formed from one or more inorganic layers such as silicon nitride, silicon dioxide, or other suitable materials.

Each light-emitting diode 26 may include light-emitting diode layers 38 interposed between a respective anode 36 and cathode 42. Anodes 36 may be patterned from a layer of metal (e.g., silver, aluminum, or other suitable metal) and/or one or more other conductive layers such as a layer of indium tin oxide, molybdenum oxide (MoOx), titanium nitride (TiNx), or other transparent conductive material. In one illustrative arrangement, anode 36 may be formed from one or more layers of non-conducting materials (e.g., silicon oxide (SiOx), silicon nitride (SiNx), or polymers) with a top layer of conductive transparent material (e.g., indium tin oxide, indium gallium zinc oxide, other transparent conductive oxides, etc.) and a bottom layer of reflective metal (e.g., silver, aluminum, a compound of reflective metals, etc.). Cathode 42 may be formed from a common conductive layer that is deposited on top of pixel definition layer 60. Cathode 42 may be formed from a thin metal layer (e.g., a layer of metal such as a magnesium silver layer) and/or indium tin oxide or other transparent conductive material. Cathode 42 is preferably sufficiently transparent to allow light 80 to exit light-emitting diode 26.

The example of FIG. 4 in which the anode of diode 26 is formed from a patterned conductive layer and the cathode of diode 26 is formed from a blanket conductive layer is merely illustrative. If desired, anode 36 may be formed from a blanket conductive layer and cathode 42 may be formed from a blanket conductive layer.

The example of FIG. 4 in which diode 26 is a "top emission" organic light-emitting diode is merely illustrative. Display 14 may be implemented using bottom emission organic light-emitting diodes, if desired.

Metal interconnect structures may be used to interconnect transistors and other components in circuitry 44. Metal interconnect lines may also be used to route signals to capacitors, to data lines D and gate lines G, to contact pads (e.g., contact pads coupled to gate driver circuitry), and to other circuitry in display 14. As shown in FIG. 4, layers 32 may include one or more layers of patterned metal for forming interconnects such as metal traces 74 (e.g., traces 74 may be used in forming data lines D, gate lines G, power supply lines, clock signal lines, and other signal lines).

If desired, display 14 may have a protective outer display layer such as cover layer 70. The outer display layer may be formed from a material such as sapphire, glass, plastic, clear ceramic, or other transparent material. Protective layer 46 may cover cathode 42. Layer 46, which may sometimes be referred to as a thin film encapsulation layer, may include moisture barrier structures, encapsulant materials such as polymers, adhesive, and/or other materials to help protect thin-film transistor circuitry.

Functional layers 68 may be interposed between layer 46 and cover layer 70. Functional layers 68 may include a touch sensor layer, a circular polarizer layer, and other layers. A circular polarizer layer may help reduce light reflections from reflective structures such as anodes 36 and cathode 42. A touch sensor layer may be formed from an array of capacitive touch sensor electrodes on a flexible polymer substrate. The touch sensor layer may be used to gather touch input from the fingers of a user, from a stylus, or from other external objects. Layers of optically clear adhesive may be used to attach cover layer 70 (e.g., a layer of glass, sapphire, polymer, or other suitable material) and functional layers 68 to underlying display layers such as layer 46, thin-film transistor circuitry 44, and substrate 30.

Light-emitting diode layers 38 may include an organic emissive layer (e.g., a red emissive layer in red diodes 26 that emits red light, a green emissive layer in green diodes 26 that emits green light, a blue emissive layer in blue diodes 26 that emits blue light, a combination of emissive materials that emit white light, etc.). The emissive material may be a material such as a phosphorescent material or fluorescent material that emits light during diode operation. The emissive material in light-emitting diode layers 38 may be sandwiched between additional diode layers such as hole injection layers, hole transport layers, electron injection layers, and electron transport layers.

As discussed in connection with FIG. 3, pixels 22 may include white organic light-emitting diodes 26 that emit white light that is filtered through a color filter to produce colored light. Color filters 76 (FIG. 3) may be located below light-emitting diodes 26 (e.g., between substrate 30 and diodes 26), or may be located above light-emitting diodes 26 (e.g., between cover layer 70 and diodes 26).

White emission from organic light-emitting diodes 26 of FIG. 4 may be achieved using one or more emissive layers and/or one or more phosphor layers to mix three primary colors (e.g., red, green, and blue) or two complementary colors (e.g., yellow/orange and blue). FIGS. 5-10 illustrate various examples of structures that may be used to form white light-emitting diodes 26 of display 14.

Figure 5:
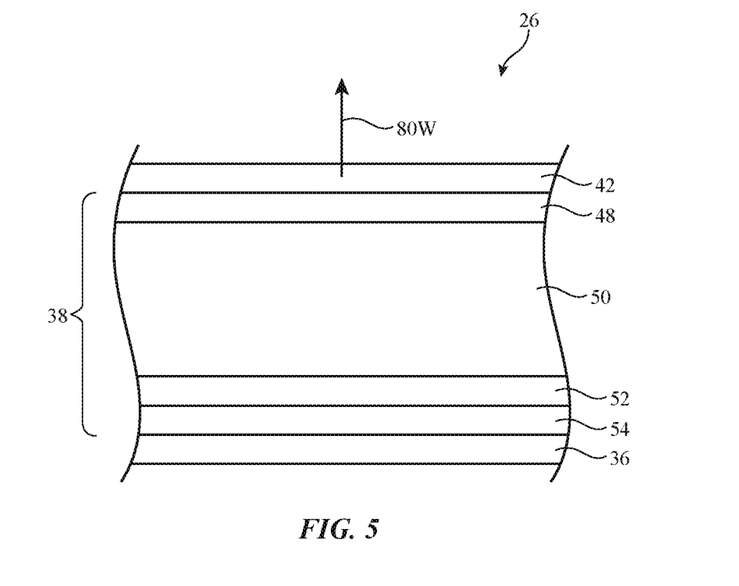
FIG. 5 is a cross-sectional side view of an illustrative white organic light-emitting diode having a single emissive layer in accordance with an embodiment.

As shown in FIG. 5, white light-emitting diode 26 may include light-emitting diode layers 38 sandwiched between anode 36 and cathode 42. Light-emitting diode layers 38 include electron transport layer 48, emissive layer 50, hole transport layer 52, and hole injection layer 54.

In the example of FIG. 5, white light-emitting diode 26 includes a single emissive layer 50 that mixes emissive materials of different colors to produce white light 80W. For example, emissive layer 50 may be a mix of primary color emissive materials that combine to form white light 80W such as red, green, and blue emissive materials, or emissive layer 50 may be a mix of complementary color emissive materials that combine to form white light 80W such as blue and yellow (or orange) emissive materials.

Figure 6:
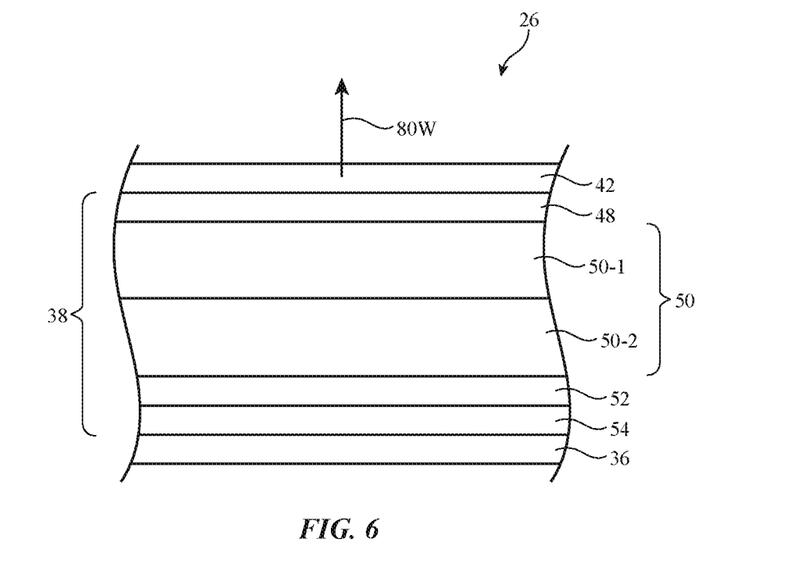
FIG. 6 is a cross-sectional side view of an illustrative white organic light-emitting diode having two emissive layers in accordance with an embodiment.
Figure 7:
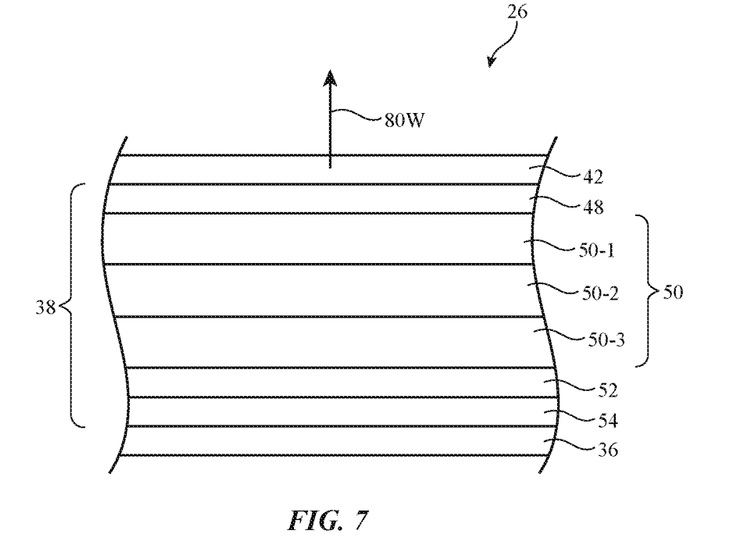
FIG. 7 is a cross-sectional side view of an illustrative white organic light-emitting diode having three emissive layers in accordance with an embodiment.

In the example of FIG. 6, emissive layer 50 of white light-emitting diode 26 includes first emissive layer 50-1 and second emissive layer 50-2. Emissive layer 50-1 and emissive layer 50-2 may be emissive materials of complementary colors that combine to form white light 80W (e.g., layer 50-1 may be blue emissive material and layer 50-2 may be yellow or orange emissive material or vice versa), or one of emissive layers 50-1 and emissive layer 50-2 may include a mix of two primary color emissive materials and the other emissive layer may include a third primary color emissive material that combine to form white light 80W (e.g., layer 50-1 may be blue emissive material and layer 50-2 may be a mix of red and green emissive materials, or vice versa).

In the example of FIG. 6, emissive layer 50 of white light-emitting diode 26 includes first emissive layer 50-1, second emissive layer 50-2, and third emissive layer 50-3. Emissive layers 50-1, 50-2, and 50-2 may be emissive materials of primary colors that combine to form white light 80W. For example, layer 50-1 may be blue emissive material, layer 50-2 may be green emissive material, and layer 50-3 may be red emissive material. This ordering of layers is merely illustrative. In general, red, green, and blue emissive layers in layer 50 of diode 26 may be stacked in any suitable order.

Figure 8:
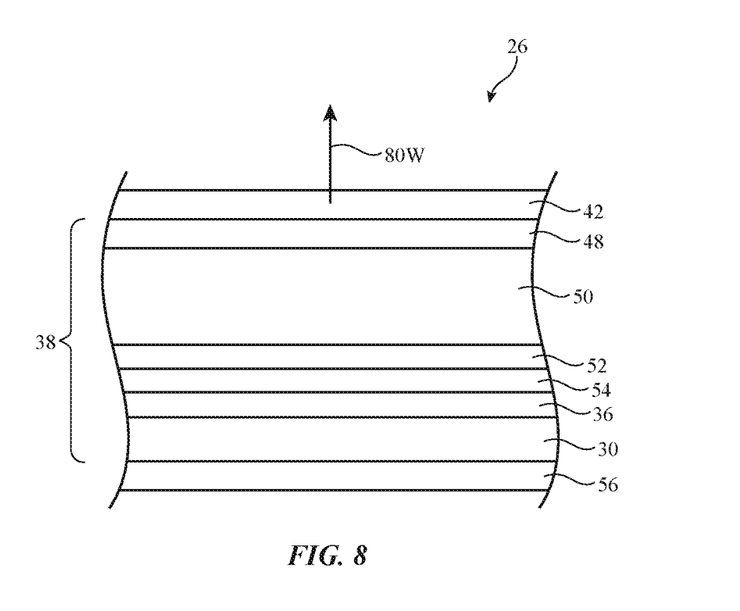
FIG. 8 is a cross-sectional side view of an illustrative white organic light-emitting diode having an emission layer and a phosphor in accordance with an embodiment.

In the example of FIG. 8, white light 80W is formed by pairing emissive layer 50 with a phosphor layer such as phosphor layer 56. Phosphor layer 56 may be formed on substrate 30 (e.g., phosphor 56 may be formed below substrate 30 as shown in the example of FIG. 8, may be formed above substrate 30, may be formed above emissive layer 50, or may be formed in other suitable locations in diode 26). Emissive layer 50 and phosphor layer 56 may produce light of complementary colors that combine to form white light 80W. For example, emissive layer 50 may emit blue light and phosphor 56 may be a yellow phosphor. Some of the blue photons from blue emissive layer 50 will be emitted from diode 26 unaltered to form blue light. Other blue photons from blue emissive layer 50 will be converted by yellow phosphor layer 56 into yellow light. The blue light and yellow light may combine to form white light 80W. The use of blue emissive material and yellow phosphor is merely illustrative. If desired, emissive layer 50 may emit ultraviolet light and/or phosphor layer 56 may emit green and/or red light.

Figure 9:
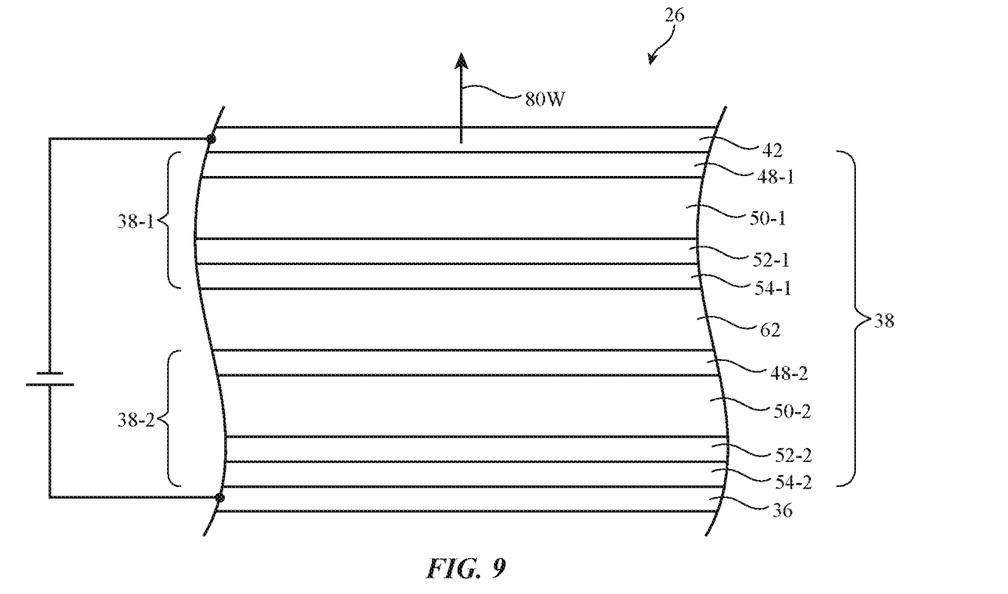
FIG. 9 is a cross-sectional side view of an illustrative white organic light-emitting diode having first and second stacked light-emitting diode units coupled in series in accordance with an embodiment.

In the example of FIG. 9, white light 80W is formed from a pair of light-emitting diode units 38-1 and 38-2 stacked in tandem. Light-emitting diode unit 38-1 includes electron transport layer 48-1, emissive layer 50-1, hole transport layer 52-1, and hole injection layer 54-1. Light-emitting diode unit 38-2 includes electron transport layer 48-2, emissive layer 50-2, hole transport layer 52-2, and hole injection layer 54-2. Light-emitting diode units 38-1 and 38-2 may emit light of complementary colors (e.g., blue and yellow or other suitable complementary colors) that combine to form white light 80W. For example, emissive layer 50-1 may emit blue light and emissive layer 50-2 may emit yellow light, or vice versa.

Light-emitting diode units 38-1 and 38-2 may be electrically connected in series. A charge-generating interconnect layer such as charge generating layer 62 may be located between units 38-1 and 38-2 and may be used to couple unit 38-1 to unit 38-2. Charge generating layer 62 may, for example, be formed from an n-type layer (sometimes referred to as an electron injecting conductive layer) and a p-type layer (sometimes referred to as a hole injecting conductive layer).

Figure 10:
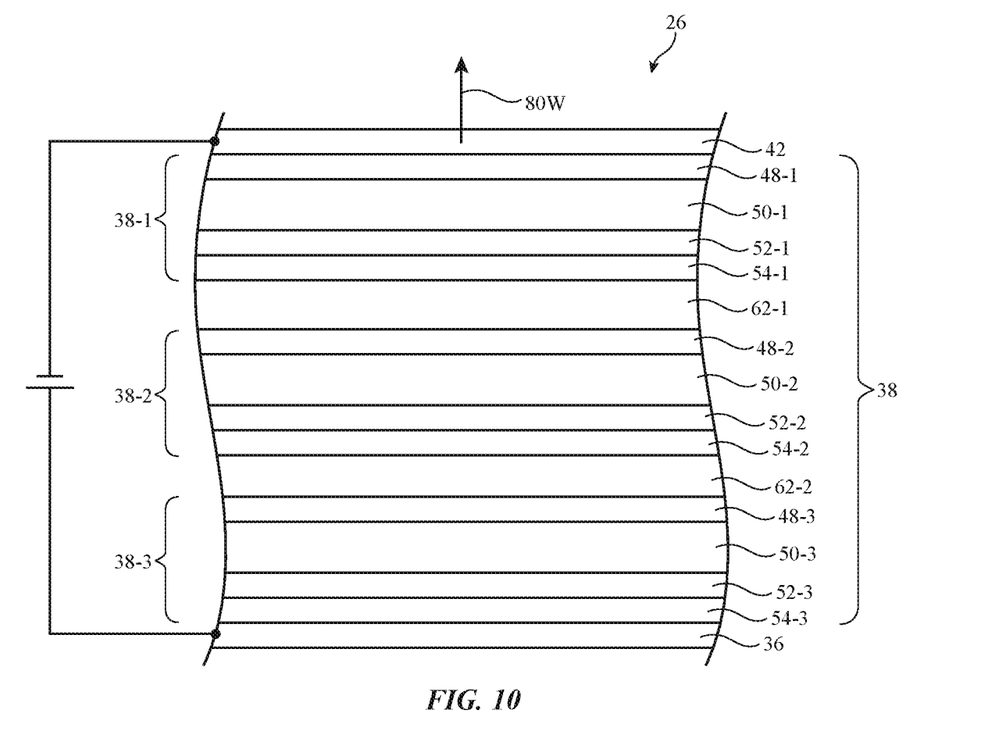
FIG. 10 is a cross-sectional side view of an illustrative white organic light-emitting diode having first, second, and third stacked light-emitting diode units coupled in series in accordance with an embodiment.

In the example of FIG. 10, white light 80W is formed from three light-emitting diode units 38-1, 38-2, and 38-3 stacked in tandem. Light-emitting diode unit 38-1 includes electron transport layer 48-1, emissive layer 50-1, hole transport layer 52-1, and hole injection layer 54-1. Light-emitting diode unit 38-2 includes electron transport layer 48-2, emissive layer 50-2, hole transport layer 52-2, and hole injection layer 54-2. Light-emitting diode unit 38-3 includes electron transport layer 48-3, emissive layer 50-3, hole transport layer 52-3, and hole injection layer 54-3. Light-emitting diode units 38-1, 38-2, and 38-3 may emit light of primary colors (e.g., red, green, and blue light) that combine to form white light 80W. For example, emissive layer 50-1 may emit blue light, emissive layer 50-2 may emit green light, and emissive layer 50-3 may emit red light. This ordering of units is merely illustrative. In general, red, green, and blue light-emitting units 38-1, 38-2, and 38-3 may be stacked in any suitable order.

Light-emitting diode units 38-1, 38-2, and 38-3 may be electrically connected in series. A first charge-generating interconnect layer such as charge generating layer 62-1 may be located between units 38-1 and 38-2 and may be used to couple unit 38-1 to unit 38-2. A second charge-generating interconnect layer such as charge generating layer 62-2 may be located between units 38-2 and 38-3 and may be used to couple unit 38-2 to unit 38-3. Charge generating layers 62-1 and 62-2 may each be formed from an n-type layer (sometimes referred to as an electron injecting conductive layer) and a p-type layer (sometimes referred to as a hole injecting conductive layer).

Figure 11:
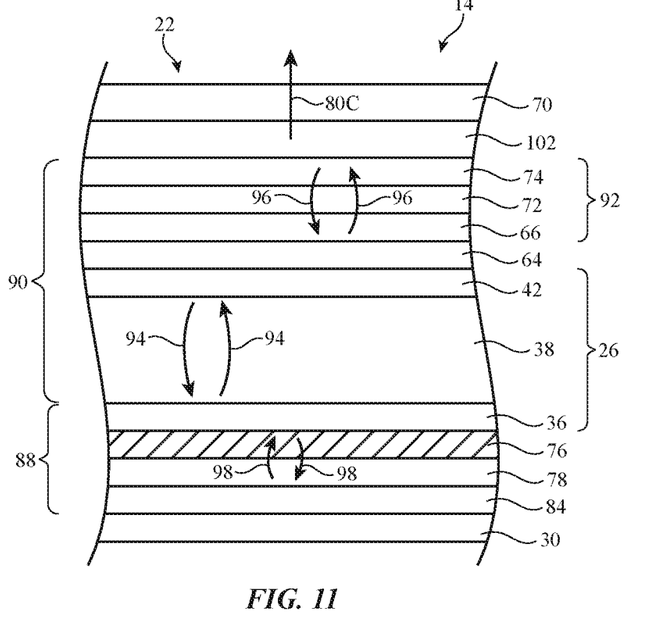
FIG. 11 is a cross-sectional side view of an illustrative pixel having a white organic light-emitting diode with a bottom color filter that forms part of a microcavity in accordance with an embodiment.
Figure 12:
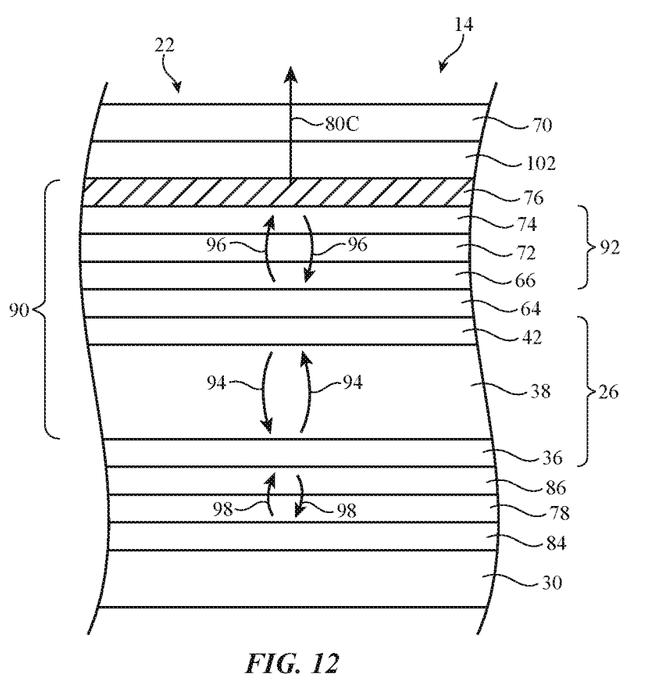
FIG. 12 is a cross-sectional side view of an illustrative pixel having a white organic light-emitting diode with a top color filter and a second microcavity in accordance with an embodiment.

In displays that form color pixels by filtering white light through color filters, care must be taken to avoid light source efficiency loss, color filter alignment errors, and color shifts at wide viewing angles. FIGS. 11 and 12 show illustrative arrangements for forming color pixels 22 using white light-emitting diodes and color filters with increased optical efficiency, reduced alignment errors, and minimal color shifts at wide viewing angles.

In the example of FIG. 11, pixel 22 of display 14 includes white light-emitting diode 26 and a color filter such as color filter 76. White light-emitting diode 26 may be formed using one of the arrangements of FIGS. 5-10 or may be formed using other light-emitting diode structures. Color filter 76 may be a red color filter, a green color filter, a blue color filter, or other suitable color filter. Color filter 76 may be formed on a high-refractive-index material such as layer 78. Layer 78 may be formed from titanium dioxide, silicon nitride, silicon oxide, or other suitable inorganic material having a relatively high refractive index. A reflective layer such as reflective layer 84 may be formed on substrate 30 below light-emitting diode 26 to reflect light upwards and out of display 14.

A capping layer such as capping layer 64 may be formed on cathode 42. Capping layer 64 may be an organic layer that helps increase transmittance through cathode 42. Barrier layers 92 may include organic layers such as organic layer 72 (e.g., manganese or other suitable organic material) and inorganic layers such as inorganic layers 66 and 74 (e.g., silicon nitride, silicon oxide, or other suitable inorganic material). Additional layers such as the layers described in connection with FIG. 4 may be used in display 14. For example, layer 102 may include protective layer 46 and/or functional layers 68 (FIG. 4). Cover layer 70 may cover organic light-emitting diodes 26.

Reflective materials such as metal and reflective interfaces (e.g., interfaces between a high-refractive-index material and a low-refractive-index material) may cause light to resonate within pixel 22. For example, electrodes 42 and 36 may be at least partially reflective and may exhibit similar effects as a micro-resonator with parallel mirrors, sometimes referred to as a microcavity (e.g., a Fabry Pérot interferometer). The spectral emission of pixel 22 may depend on the resonator properties of the microcavity (or multiple microcavities) within pixel 22. Optical efficiency of the pixel may increase when constructive interference occurs between the incident light and the reflected light in the microcavity. Microcavity effects can be optimized by tuning the thicknesses of the layers in pixel 22 and/or by selecting certain materials to achieve the desired resonant effect (e.g., selecting materials with different indices of refraction, different reflectivity levels, etc.).

Pixel 22 may include one or more microcavities that increase optical efficiency of the pixel. A first microcavity may be formed between anode 36 and cathode 42 (as illustrated by resonating light 94), a second microcavity may be formed between barrier layers 92 (as illustrated by resonating light 96), and a third microcavity may be formed between anode 36 and high-refractive-index layer 78 (as illustrated by light 98). These microcavities may be tuned to optimize optical efficiency of pixel 22.

During operation, white light from diode 26 resonates in the microcavities within pixel 22 and is filtered by color filter 76 to produce colored light 80C. The microcavity formed from anode 36, color filter layer 76, and high-refractive index layer 78 may serve multiple purposes. First, the difference in refractive index between color filter layer 76 (e.g., a low-refractive-index material such as polymer) and high-refractive-index layer 78 causes light 98 to resonate within layers 76 and 78, leading to constructive interference and therefore increased optical efficiency and better viewing angle performance. The difference in refractive index between layers 78 and 76 may be 0.4, 0.5, 0.6, 0.8, 1, greater than 1, or less than 1. Second, this microcavity effect means that light 98 passes through color filter 76 multiple times before it exits pixel 22 as colored light 80C. Because light 98 passes through filter 76 multiple times, color filter 76 may be relatively thin. Thin color filter layers may in turn reduce unnecessary absorption in pixel 22.

Additionally, color filter 76 of FIG. 11 is formed below light-emitting diode 26 and may therefore allow for greater flexibility in the types of deposition methods that are used to deposit color filter material 76 on substrate 30. For example, layers 88 may be formed using thin-film-transistor array processes and layers 90 may be formed from organic light-emitting diode and thin-film encapsulation processes. Because layers 88 are formed on substrate 30 prior to organic light-emitting diode layers 38, photolithographic techniques, fine metal mask techniques, or other techniques may be used to deposit color filters (e.g., red, green, and blue color filters) on substrate 30 without the risk of damaging organic light-emitting diode layers 38.

This is, however, merely illustrative. If desired, color filter layer 76 may be formed above light-emitting diode 26. An example of this type of arrangement is illustrated in FIG. 12.

As shown in FIG. 12, pixel 22 of display 14 includes white light-emitting diode 26 and a color filter such as color filter 76. White light-emitting diode 26 may be formed using one of the arrangements of FIGS. 5-10 or may be formed using other light-emitting diode structures. Color filter 76 may be a red color filter, a green color filter, a blue color filter, or other suitable color filter. Color filter 76 may be formed on barrier layers 92. A reflective layer such as reflective layer 84 may be formed on substrate 30 below light-emitting diode 26 to reflect light upwards and out of display 14.

Additional layers such as the layers described in connection with FIG. 4 may be used in display 14. For example, layer 102 may include protective layer 46 and/or functional layers 68 (FIG. 4). Cover layer 70 may cover organic light-emitting diodes 26.

A capping layer such as capping layer 64 may be formed on cathode 42. Capping layer 64 may be an organic layer that helps increase transmittance through cathode 42. Barrier layers 92 may include organic layers such as organic layer 72 (e.g., manganese or other suitable organic material) and inorganic layers such as inorganic layers 66 and 74 (e.g., silicon nitride, silicon oxide, or other suitable inorganic material).

Pixel 22 may include one or more microcavities that increase optical efficiency of the pixel. A first microcavity may be formed between anode 36 and cathode 42 (as illustrated by resonating light 94), a second microcavity may be formed between barrier layers 92 (as illustrated by resonating light 96), and a third microcavity may be formed between anode 36 and high-refractive-index layer 78 (as illustrated by light 98). Low-refractive-index layer 86 may be formed from an inorganic layer (e.g., an oxide material or other inorganic material) or an organic layer (e.g., a polymer material or other organic material). High-refractive-index layer 78 may be formed from titanium dioxide, silicon nitride, silicon oxide, or other suitable inorganic material having a relatively high refractive index. The difference in refractive index between layers 78 and 86 may be 0.4, 0.5, 0.6, 0.8, 1, greater than 1, or less than 1. The microcavities in pixel 22 may be tuned to optimize optical efficiency of pixel 22.

During operation, white light from diode 26 resonates in the microcavities within pixel 22 and is filtered by color filter 76 to produce colored light 80C. The difference in refractive index between low-refractive-index layer 86 and high-refractive-index layer 78 causes light 98 to resonate within layers 86 and 78, leading to constructive interference and therefore increased optical efficiency and better viewing angle performance.

In accordance with an embodiment, an organic light-emitting diode display is provided that includes a substrate, a cover layer, a white organic light-emitting diode interposed between the substrate and the cover layer, and a color filter interposed between the white organic light-emitting diode and the substrate.

In accordance with another embodiment, the organic light-emitting diode display includes a high-refractive-index layer interposed between the substrate and the color filter.

In accordance with another embodiment, the organic light-emitting diode display includes a reflective layer interposed between the high-refractive-index layer and the substrate.

In accordance with another embodiment, the reflective layer includes metal.

In accordance with another embodiment, the high-refractive-index layer includes a material selected from the group consisting of titanium dioxide and silicon nitride.

In accordance with another embodiment, the white organic light-emitting diode includes an anode, and the anode, the high-refractive-index layer, and the color filter form a microcavity that causes light from the light-emitting diode to resonate between the high-refractive-index layer and the anode.

In accordance with another embodiment, the white organic light-emitting diode includes an emissive layer that mixes three primary colors to form white light.

In accordance with another embodiment, the white organic light-emitting diode includes multiple emissive layers that each emit light of an associated color and the light from the multiple emissive layers combines to form white light.

In accordance with another embodiment, the white organic light-emitting diode includes a blue emissive layer that emits blue light and a phosphor that converts some of the blue light to yellow light and the blue light and the yellow light combine to form white light.

In accordance with another embodiment, the white organic light-emitting diode includes at least two light-emitting diode units stacked in tandem and coupled in series.

In accordance with an embodiment, an organic light-emitting diode pixel is provided that includes a substrate, a white organic light-emitting diode on the substrate, the white organic light-emitting diode includes an anode, a cover layer formed over the white organic light-emitting diode, and a first layer having a first refractive index and a second layer having a second refractive index that is higher than the first refractive index, the first and second layers are interposed between the white organic light-emitting diode and the substrate, the anode, the first layer, and the second layer form a microcavity, and light from the white organic light-emitting diode resonates within the microcavity.

In accordance with another embodiment, the organic light-emitting diode pixel includes a color filter interposed between the cover layer and the white organic light-emitting diode.

In accordance with another embodiment, the first layer includes a color filter layer.

In accordance with another embodiment, the organic light-emitting diode pixel includes a metal reflector interposed between the second layer and the substrate.

In accordance with another embodiment, the organic light-emitting diode pixel includes a capping layer interposed between the cover layer and the white organic light-emitting diode.

In accordance with an embodiment, a display is provided that includes a substrate, an array of organic light-emitting diodes on the substrate that emit white light, a color filter array that filters the white light to produce colored light, a cover layer over the array of organic light-emitting diodes, the colored light passes through the cover layer; and a microcavity between each organic light-emitting diode and the substrate, at least some of the white light resonates in the microcavity before passing through the cover layer as colored light.

In accordance with another embodiment, the microcavity is formed from first and second layers having different indices of refraction.

In accordance with another embodiment, the first layer of the microcavity is formed from a portion of the color filter array.

In accordance with another embodiment, the display includes a metal reflector interposed between the microcavity and the substrate.

In accordance with another embodiment, the display includes a capping layer interposed between the array of organic light-emitting diodes and the cover layer.

The foregoing is merely illustrative and various modifications can be made by those skilled in the art without departing from the scope and spirit of the described embodiments. The foregoing embodiments may be implemented individually or in any combination.

What is claimed is:

1. An organic light-emitting diode display, comprising:
   a substrate;
   a cover layer;
   a white organic light-emitting diode interposed between the substrate and the cover layer;
   a color filter interposed between the white organic light-emitting diode and the substrate; and
   a layer interposed between the substrate and the color filter, wherein the layer has a higher refractive index than the color filter.

2. The organic light-emitting diode display defined in claim 1 further comprising a reflective layer interposed between the layer and the substrate.

3. The organic light-emitting diode display defined in claim 2 wherein the reflective layer comprises metal.

4. The organic light-emitting diode display defined in claim 3 wherein the layer comprises a material selected from the group consisting of: titanium dioxide and silicon nitride.

5. The organic light-emitting diode display defined in claim 1 wherein the white organic light-emitting diode comprises an anode, and wherein the anode, the layer, and the color filter form a microcavity that causes light from the light-emitting diode to resonate between the layer and the anode.

6. The organic light-emitting diode display defined in claim 1 wherein the white organic light-emitting diode comprises an emissive layer that mixes three primary colors to form white light.

7. The organic light-emitting diode display defined in claim 1 wherein the white organic light-emitting diode comprises multiple emissive layers that each emit light of an associated color and wherein the light from the multiple emissive layers combines to form white light.

8. The organic light-emitting diode display defined in claim 1 wherein the white organic light-emitting diode comprises a blue emissive layer that emits blue light and a phosphor that converts some of the blue light to yellow light and wherein the blue light and the yellow light combine to form white light.

9. The organic light-emitting diode display defined in claim 1 wherein the white organic light-emitting diode comprises at least two light-emitting diode units stacked in tandem and coupled in series.

10. An organic light-emitting diode pixel, comprising:
    a substrate;
    a white organic light-emitting diode on the substrate, wherein the white organic light-emitting diode comprises an anode;
    a cover layer formed over the white organic light-emitting diode; and
    a first layer having a first refractive index and a second layer having a second refractive index that is higher than the first refractive index, wherein the first and second layers are interposed between the white organic light-emitting diode and the substrate, wherein the anode, the first layer, and the second layer form a microcavity, wherein light from the white organic light-emitting diode resonates within the microcavity, and wherein the first layer comprises a color filter layer.

11. The organic light-emitting diode pixel defined in claim 10 further comprising a metal reflector interposed between the second layer and the substrate.

12. The organic light-emitting diode pixel defined in claim 10 further comprising a capping layer interposed between the cover layer and the white organic light-emitting diode.

13. A display, comprising:
    a substrate;
    an array of organic light-emitting diodes on the substrate that emit white light;
    a color filter array that filters the white light to produce colored light;
    a cover layer over the array of organic light-emitting diodes, wherein the colored light passes through the cover layer; and
    a microcavity between each organic light-emitting diode and the substrate, wherein at least some of the white light resonates in the microcavity before passing through the cover layer as colored light, wherein the microcavity is formed from first and second layers having different indices of refraction, and wherein the first layer of the microcavity is formed from a portion of the color filter array.

14. The display defined in claim 13 further comprising a metal reflector interposed between the microcavity and the substrate.

15. The display defined in claim 14 further comprising a capping layer interposed between the array of organic light-emitting diodes and the cover layer.

* * * * *